(12) United States Patent
Tai

(10) Patent No.: US 7,323,918 B1
(45) Date of Patent: Jan. 29, 2008

(54) MUTUAL-INTERPOLATING DELAY-LOCKED LOOP FOR HIGH-FREQUENCY MULTIPHASE CLOCK GENERATION

(75) Inventor: Gwo-Chung Tai, San Jose, CA (US)

(73) Assignee: Micrel, Incorporated, San Jose, CA (US)

( * ) Notice: Subject to any disclaimer, the term of this patent is extended or adjusted under 35 U.S.C. 154(b) by 0 days.

(21) Appl. No.: 11/463,290

(22) Filed: Aug. 8, 2006

(51) Int. Cl.
*H03L 7/06* (2006.01)
(52) U.S. Cl. .................. 327/158; 327/149; 327/161
(58) Field of Classification Search ............... None
See application file for complete search history.

(56) References Cited

U.S. PATENT DOCUMENTS

| 5,614,855 | A | 3/1997 | Lee et al. | |
| 6,169,436 | B1 * | 1/2001 | Marbot | 327/270 |
| 6,788,123 | B2 * | 9/2004 | Roy | 327/261 |
| 6,897,693 | B2 | 5/2005 | Kim | |
| 6,958,634 | B2 * | 10/2005 | Rashid | 327/141 |
| 7,116,147 | B2 * | 10/2006 | Kase | 327/158 |

OTHER PUBLICATIONS

Jung et al. "A Dual-Loop Delay-Locked Loop Using Multiple Voltage-Controlled Delay Lines," IEEE Journal of Solid-State Circuits, vol. 36, No. 5, May 2001, pp. 784-791.
Sun et al. "A 1.25GHz 0.35-μm Monolithic CMOS PLL Based on a Multiphase Ring Oscillator," IEEE Journal of Solid-State Circuits, vol. 36, No. 6, Jun. 2001, pp. 910-916.

* cited by examiner

*Primary Examiner*—Cassandra Cox
(74) *Attorney, Agent, or Firm*—Bever, Hoffman & Harms, LLP; Patrick T. Bever

(57) ABSTRACT

A delay-locked loop (DLL) circuit with mutual-interpolating architecture that provides multiple-phase clock generation is presented. Each delay-cell in the DLL circuit delay chain is effectively an interpolator that combines two input clock signals: one input clock signal is received from the output clock of previous stage in the delay chain, and the other input clock signal is fed back from a following stage. Each delay cell supports the concurrent functions of delay and interpolation. The architecture imposes a set of N simultaneous equations, where N is the total number of delay clock signals, to control the clock waveforms. These simultaneous equations obtain a unique solution when the DLL enters a lock state, and the generated delay clock signals inherently have a clock duty cycle of 50%. The delay chain can be implemented using either odd or even number of delay cells.

20 Claims, 10 Drawing Sheets

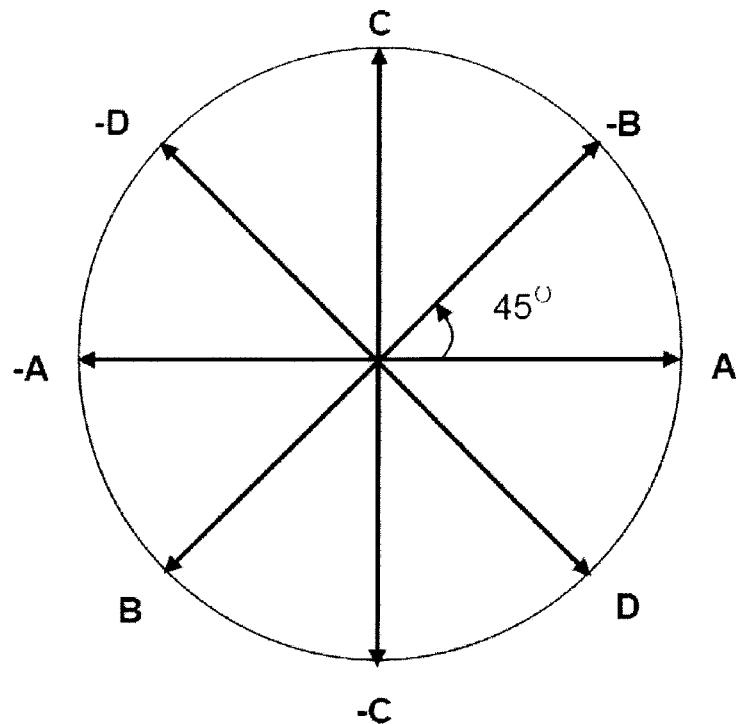
FIG. 3
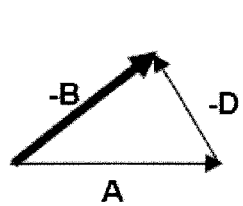 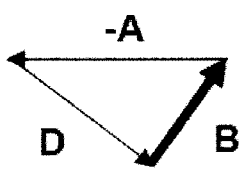 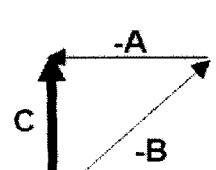 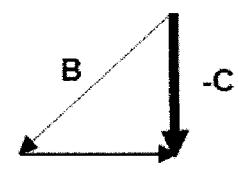
FIG. 4(A)      FIG. 4(B)      FIG. 4(C)      FIG. 4(D)
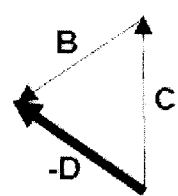 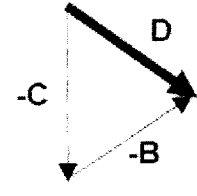 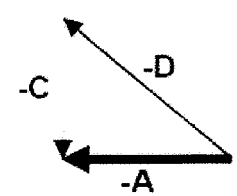 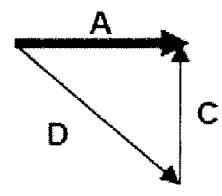
FIG. 4(E)      FIG. 4(F)      FIG. 4(G)      FIG. 4(H)

MUTUAL-INTERPOLATING DELAY-LOCKED LOOP FOR HIGH-FREQUENCY MULTIPHASE CLOCK GENERATION

FIELD OF THE INVENTION

The present invention relates to semiconductor integrated circuits (ICs) that utilize delay-locked loop (DLL) circuits, and particularly to the generation of multiple phase clocks with 50% duty cycles from such DLL circuits.

BACKGROUND OF THE INVENTION

DLL circuits are utilized in a broad range of applications that include microprocessors, memory devices (DRAM), and clock and data recovery in a communication system. Clock generation using DLL circuits has been an essential design building block in IC systems. The quality of multiphase clock signals generated by DLL circuits plays an important role and directly determines the performance of a system. In particular, in today's IC applications, the technology trend of higher frequency and faster data processing rate results in using both rising and falling clock edges, which necessitates high quality clock signals. Furthermore, a system may operate simultaneously using multiple clock phases (i.e., multiple clock signals having the same period but different phases), which imposes a strict requirement on the duty cycle of the various delay clock signals. In general, a system operating with clock signals having 50% duty cycles supports wider timing margin and hence better system performance and better tolerance to temperature and semiconductor process variation than a system having clock signals that do not have a 50% duty cycle.

FIG. 12 is a simplified diagram showing a conventional DLL circuit 50, which includes a serial connection of delay cells 51 to 54, a phase detector 56, a charge pump 58, and loop filter 59.

Each delay cell 51 to 54 includes a delay buffer DLY and a bias circuit 55, and generates an associated delayed clock signal CK1 to CKN. A Reference Clock signal having a reference clock cycle ($T_{PERIOD}$) is applied to an input terminal of the delay buffer DLY of initial delay cell 51 and to a first input terminal of phase detector 56. The delay buffer DLY of initial delay cell 51 generates a first delayed clock signal CK1 having a phase that differs from the applied Reference Clock signal by a first delay amount that is determined by an operating state of associated delay circuit 55. Second delay cell 52 receives first delayed clock signal CK1, and generates a second delayed clock signal CK2 having a phase that differs from the applied Reference Clock signal by a second delay amount, which is ideally two times the first delay amount. Similarly, third delay cell 53 receives second delayed clock signal CK2, and generates a third delayed clock signal CK3 that phase that differs from the applied Reference Clock signal by a third (i.e., 3×) delay amount. Finally, a last delay cell 54 generates an Nth delayed clock signal CKN that is applied to a second input terminal of phase detector 56.

Phase detector 56, charge pump 58, and loop filter 59 cooperate to control the delay periods t1 to tN of delay cells 51 to 54 such that the Nth delayed clock signal CKN is synchronized to (i.e., in phase with) the Reference Clock signal. Phase detector 56 generates output signals (e.g., UP and DOWN) that are used to control charge pump 58, which cooperates with loop filter 59 to generate a feedback control signal $V_{cnt1}$ that is used to control bias circuits 55 of each of the delay cells 51 to 54. When conventional DLL circuit 50 is in an ideal lock condition, clock signals CK1 to CKN are distributed uniformly in one period of a reference clock cycle ($T_{PERIOD}$) due to the substantially identical delay cells 51 to 54. That is, because of the feedback loop, the fundamental constraint on conventional DLL circuit 50 is that a sum of the delays contributed from each delay cell 51 to 54 has to be equal to $T_{PERIOD}$ (i.e., $t_1+t_2+t_3+\ldots+t_N=T_{PERIOD}$; where N is the total number of delay units).

A problem associated with conventional DLL circuit 50 is that there are no constrains on the duty cycle of each clock signal CK1 to CKN. Due to parasitic loading of each stage (i.e., each delay cell), the waveform and duty cycle of clock signals CK1 to CKN are progressively degraded through the delay chain. As a result, conventional DLL circuit 50 is not able to guarantee the quality of clock signals CK1 to CKN because it lacks physical architecture and circuit constraints needed to produce high quality clock waveforms having a 50% duty cycle. Mathematically, the architecture of a conventional DLL establishes only one constraint equation (i.e., $t_1+t_2+t_3+\ldots+t_N=T_{PERIOD}$), and there is no guarantee that the phases are uniform (i.e., $t1=t2=t3\ldots=tN$). As clock frequencies reach the GHz (gigahertz) range and above, conventional DLL circuit 50 becomes more difficult to operate due to inherent process mismatch and parasitic loading imposed on the semiconductor device during manufacture.

What is needed is a DLL circuit that overcomes the duty cycle offset problems associated with conventional DLL circuits, and generates consistent multiphase clock signals regardless of fabrication process variations.

SUMMARY OF THE INVENTION

The present invention is directed to a delay-locked loop (DLL) circuit that eliminates the duty cycle offset problem associated with conventional DLL circuits by utilizing a mutual-interpolating delay cell chain in which the delay clock signal(s) generated by each delay cell are produced by delaying and interpolating two or more delay clock signals received from two or more different delay cells of the delay cell chain. Similar to conventional DLL circuits, the DLL circuit of the present invention utilizes an outer loop feedback circuit (e.g., formed by a phase detector, a charge pump, and a loop filter) to provide a delay control signal that is transmitted to the delay cells of the delay cell chain. In addition, each delay cell of the delay cell chain utilizes the delay control signal to delay a first delay clock signal received from a preceding delay cell in the chain (or the reference clock signal, in the case of the first delay cell in the chain). However, in addition to the delay circuit utilized to delay the first delay clock signal, each delay cell of the mutual-interpolating delay cell chain also includes a second delay circuit that is connected by one or more sub-loop feedback lines to receive a second delay clock signal from a second delay cell (e.g., a delay cell that is located downstream in the delay cell chain). This second delay clock signal is then interpolated with the first delay clock signal, thereby producing the delay clock signal output from that delay cell. In this manner, the mutual-interpolating delay cell chain imposes a set of N simultaneous equations in the generation of the delay clock signals, where N is the total number of delay clock signals. These simultaneous equations obtain a unique solution when the DLL circuit enters lock state (i.e., when the delayed clock signal generated by a final delay cell in the chain is synchronized with the reference clock signal). By arranging the sub-loop feedback lines and interpolating the first and second input clock signals in this manner, each delay clock signal output from its delay cell inherently achieves a 50% clock duty cycle because of the N constraint equations. Thus, the DLL circuit of the present invention provides multiple phase high-frequency clock generation for IC devices in which parasitic loading is crucial to the system performance.

BRIEF DESCRIPTION OF THE DRAWINGS

These and other features, aspects and advantages of the present invention will become better understood with regard to the following description, appended claims, and accompanying drawings, where:

FIG. 3 is a simplified circular phase diagram depicting the clock signals of FIGS. 2(A)-2(H);

FIGS. 4(A), 4(B), 4(C), 4(D), 4(E), 4(F), 4(G), and 4(H) are simplified diagrams depicting the clock signals of FIGS. 2(A)-2(H) in a vector form;

DETAILED DESCRIPTION OF THE DRAWINGS

The present invention relates to an improved delay-locked loop (DLL) circuit. The following description is presented to enable one of ordinary skill in the art to make and use the invention as provided in the context of a particular application and its requirements.

Figure 1:
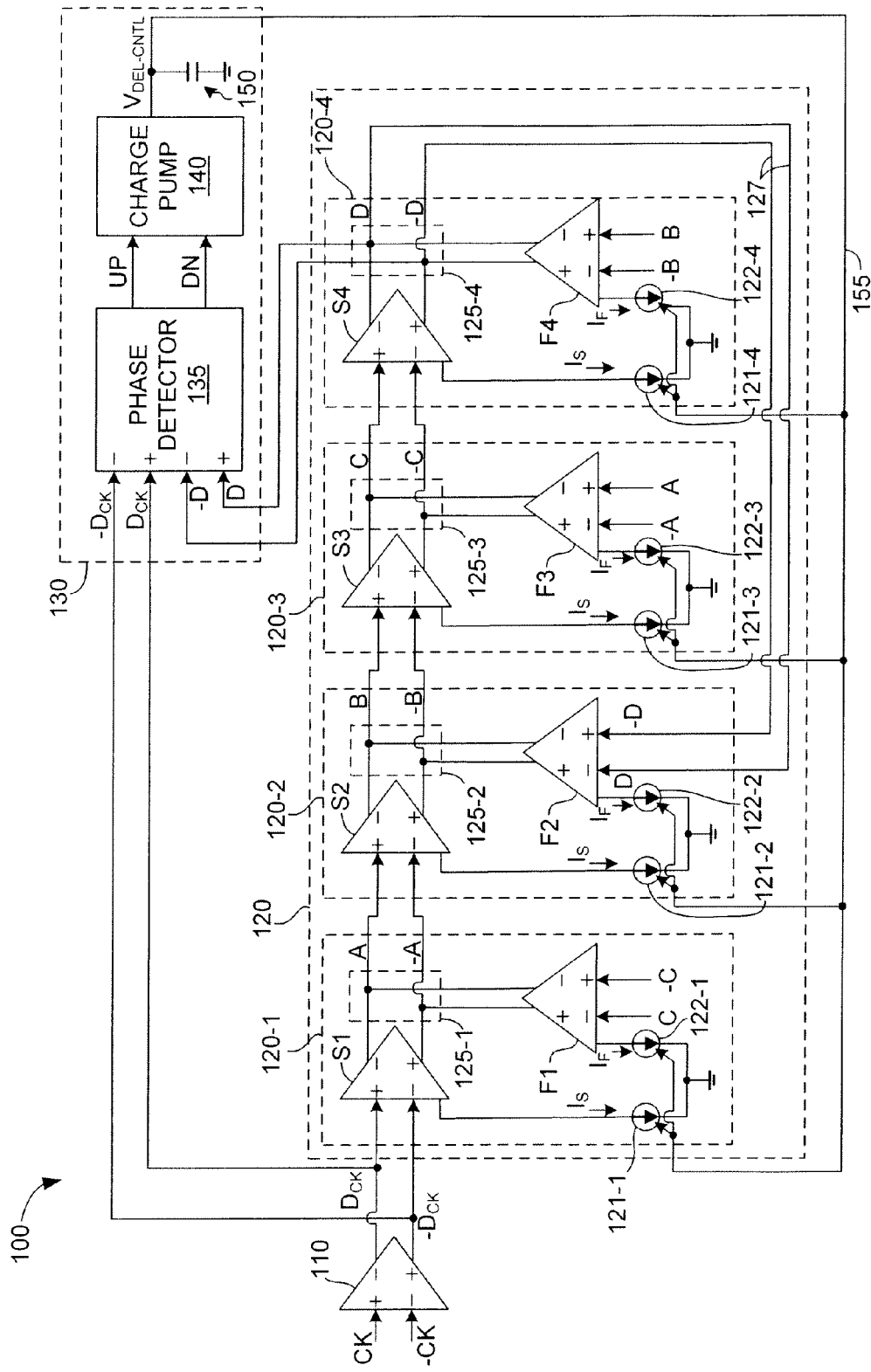
FIG. 1 is a simplified circuit diagram showing a DLL circuit according to an embodiment of the present invention.
Figure 2:
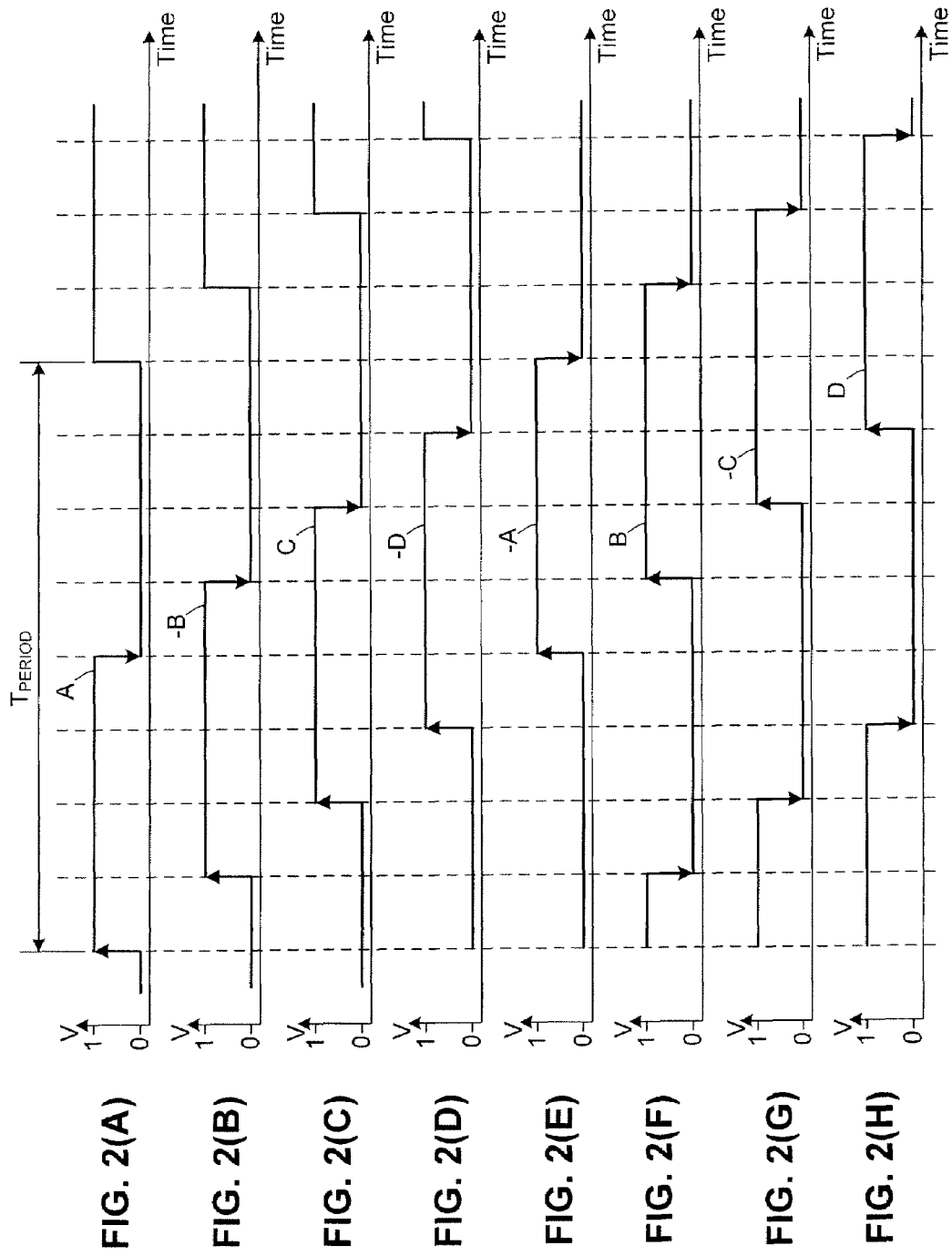
FIGS. 2(A), 2(B), 2(C), 2(D), 2(E), 2(F), 2(G), and 2(H) is a timing diagram showing clock signals generated by the DLL circuit of FIG. 1.

FIG. 1 is a block diagram showing a four-stage DLL circuit 100 according to a simplified exemplary embodiment of the present invention. Similar to conventional DLL circuits, DLL circuit 100 generally includes an optional input buffer 110, a delay cell chain 120, and an outer loop feedback circuit 130 including a phase detector 135, a charge pump 140, and loop filter 150. Phase detector 135 has one or more first input terminals coupled to receive the applied reference clock signal (i.e., $-D_{CK}$ and $D_{CK}$), one or more second input terminal coupled to receive a selected delay clock signal (i.e., D and –D) generated by last-sequential delay cell 120-4 of delay cell chain 120. Similar to conventional DLL circuits, phase detector 135 utilizes known techniques to compare the applied reference clock signals ($D_{CK}$ and/or $-D_{CK}$) with the delay clock signals (D and/or –D), and generates output signals (e.g., UP and DOWN) that are used to control charge pump 140, which cooperates with loop filter 150 to generate delay control signal $V_{DEL-CNTL}$. Delay control signal $V_{DEL-CNTL}$ is transmitted to control bias circuits 121 and 122 of each of the delay cells 120-1 to 120-4. When DLL circuit 100 is in an ideal lock condition, delay clock signals D/–D are synchronized with reference clock signals $D_{CK}/-D_{CK}$, and delay clock signals A, –A, B, –B, C, –C, D and –D are distributed uniformly in one period of reference clock signal $D_{CK}$. As set forth below, DLL circuit 100 differs from conventional DLL circuits in that, in addition to using outer loop feedback circuit 130 to introduce a series of delays that produce the desired clock phases, delay cell chain 120 includes a mutual-interpolating arrangement that inherently causes each of the delay clock signals to have a 50% clock duty cycle.

Referring to the left side of FIG. 1, optional input buffer 110 receives reference clock signals CK and –CK having a predetermined clock period (herein "$T_{PERIOD}$"), and generates a pair of buffered reference clock signals $D_{CK}$ and $-D_{CK}$ that are provided to delay cell chain 120 and phase detector 135. In accordance with an aspect of the present invention, buffered reference clock signals $D_{CK}$ and $-D_{CK}$ have characteristics (e.g., voltage level and slew) that are similar to the characteristics of the delay clock signals generated inside delay cell chain 120 (discussed below). To achieve this signal characteristic similarity, in one embodiment input buffer 110 is fabricated to be substantially identical to the drivers (e.g., drivers S1 and F1) utilized in delay cell chain 120. If input buffer 110 is omitted and reference clock signals CK and –CK are substantially different from the delay clock signals generated inside delay cell chain 120, then signal errors may be generated in an initial delay cell (e.g., delay cell 120-1) that may propagate through delay cell chain 120, thus reducing the quality of the generated delay clock signals. On the other hand, in embodiments where reference clock signals CK and –CK are substantially identical to the delay clock signals generated in delay cell chain 120, it may be possible to omit input buffer 110. Note that, as used herein, negative signs (e.g., "$-D_{CK}$" versus "$D_{CK}$") are utilized in a conventional sense to designate 180° phase differences (e.g., the phase of buffered reference clock signal $D_{CK}$ differs from the phase of buffered reference clock signal $-D_{CK}$ by 180°).

Delay cell chain 120 includes four differential delay cells 120-1 to 120-4 that are connected in series between the output terminals of buffer 110 and associated input terminals of phase detector 135. Each delay cell 120-1 to 120-4 includes a first (S) driver that receives one or more first input clock signals, a second (F) driver that receives one or more second input clock signals, and bias circuits that are utilized to control the delay characteristics of the two drivers. In accordance with an aspect of the present invention, the first and second drivers are either arranged to produce an interpolating function at their shared output nodes, or a separate interpolator circuit is provided to perform the interpolation function. For example, delay cell 120-1 includes a first driver S1, a second driver F1, a first bias circuit 121-1 connected between driver S1 and ground, a second bias circuit 122-1 connected between driver F1 and ground, and an interpolator 125-1 that is connected to the output terminals of drivers S1 and F1. Similarly, delay cell 120-2 includes a first driver S2, a second driver F2, associated bias circuits 121-2 and 122-2, and an interpolator 125-2, delay cell 120-3 includes drivers S3 and F3, associated bias circuits 121-3 and 122-3, and an interpolator 125-3, and delay cell 120-4 includes drivers S4 and F4, associated bias circuits 121-4 and 122-4, and an interpolator 125-4.

Similar to conventional DLL circuits, the first (S) driver of each delay cell 120-1 to 120-4 receives one or more (first) input clock signals on its input terminal(s), and generates one or more (first) output clock signals at its output terminal(s) that are delayed by an amount determined by outer feedback loop circuit 130 and that delay cell's associated bias circuit. For example, driver S1 of delay cell 120-1 receives buffered reference signal $D_{CK}$ on its noninverting (+) input terminal and buffered reference signal $-D_{CK}$ on its inverting (−) input terminal, and generates corresponding output clock signals on its noninverting (+) and inverting (−) output terminals that are delayed by amounts determined by bias circuit 121-1, which is controlled by delay control signal $V_{DEL-CNTL}$ received from outer loop feedback circuit 130. Similarly, driver S2 of delay cell 120-2 receives delay clock signals A and −A and generates corresponding output clock signals that are delayed by bias circuit 121-2, driver S3 of delay cell 120-3 receives delay clock signals B and −B and generates corresponding output clock signals that are delayed by bias circuit 121-3, and driver S4 of delay cell 120-4 receives delay clock signals C and −C and generates corresponding output clock signals that are delayed by bias circuit 121-4.

In accordance with an aspect of the present invention, the second (F) driver of each delay cell 120-1 to 120-4 receives one or more (second) input clock signals from a selected (second) delay cell via one or more sub-loop feedback lines, where the selected delay cell is different from the source of the first input signal provided to the first (S) driver. For example, as indicated in FIG. 1, driver F2 of delay cell 120-2 receives delay clock signals D and −D on sub-loop feedback lines 127 from delay cell 120-4. Although omitted for clarity, delay cell chain includes additional sub-loop feedback lines that route selected delay clock signals to each of the remaining delay cells. For example, delay clock signals C and −C are routed from delay cell 120-3 to driver F1 of delay cell 120-1, delay clock signals A and −A are routed from delay cell 120-1 to driver F3 of delay cell 120-3, and delay clock signals B and −B are routed from delay cell 120-2 to driver F4 of delay cell 120-4.

Similar to drivers S1 to S4, drivers F1 to F4 generate output clock signals at their respective output terminal(s) that are delayed by an amount determined by associated bias circuits 122-1 to 122-4, respectively. For example, driver F1 of delay cell 120-1 receives delay clock signals C and −C, and generates corresponding output clock signals on its output terminals that are delayed by amounts determined by bias circuit 122-1. Similarly, driver F2 of delay cell 120-2 receives delay clock signals D and −D and generates corresponding output clock signals that are delayed by bias circuit 122-2, driver F3 of delay cell 120-3 receives delay clock signals A and −A and generates corresponding output clock signals that are delayed by bias circuit 122-3, and driver F4 of delay cell 120-4 receives delay clock signals B and −B and generates corresponding output clock signals that are delayed by bias circuit 122-4.

Similar to conventional DLL circuits, the bias circuits of each delay cell 120-1 to 120-4 are controlled by delay control signal $V_{DEL-CNTL}$ that is transmitted on a delay loop line 155 from charge pump 140. For example, both driver S1 and driver F1 of delay cell 120-1 receive the same delay control signal $V_{DEL-CNTL}$. However, in accordance with another aspect of the present invention, bias circuits 121-1 and 122-1 are fabricated such that biasing current $I_S$ through bias circuit 121-1 has twice the magnitude of baising current $I_F$ through bias circuit 122-1. The purpose for these different biasing currents is described below.

According to another aspect of the present invention, interpolators 125-1 to 125-4 of delay cells 120-1 to 120-4 interpolate (combine) the output clock signals generated by the S and F drivers to produce delay clock signals A, −A, B, −B, C, −C, D, and −D. Due to active interpolation performed by each delay cell 120-1 to 120-4 produces eight delay clock signals A, −A, B, −B, C, −C, D, and −D having eight unique clock phases (i.e., the clock phase of each delay clock signal is different from that of all of the other delay clock signals). In addition, the different bias currents $I_S$ and $I_F$ in each of the delay cells 120-1 to 120-4 produce constraints under which the duty cycle of each delay clock signal A, −A, B, −B, C, −C, D, and −D is either equal to 50% (i.e., when the duty cycle of reference clock signal CK is equal to 50%), or is equal or closer to a 50% duty cycle than the closer duty cycle of reference clock signal CK when the duty cycle of reference clock signal CK is not equal to 50% (i.e., the duty cycle of delay clock signals A, −A, B, −B, C, −C, D, and −D is no worse than the duty cycle of reference clock signal CK). Further, because of outer feedback loop circuit 130 (i.e., delay control signal $V_{DLY-CNTL}$), the clock phases applied to phase detector 135 (i.e., buffered reference clock signals $D_{CK}$ and $-D_{CK}$, and delay clock signals D and −D) are aligned in time domain, which results in $D_{CK}=D$ and $-D_{CK}=-D$, when DLL circuit 100 operates in lock state. As a result, all of delay clock signals A, −A, B, −B, C, −C, D, and −D have a time period that is equal to time period $T_{PERIOD}$ of reference clock signal CK, each delay clock signals A, −A, B, −B, C, −C, D, and −D has a unique phase, and all of delay clock signals A, −A, B, −B, C, −C, D, and −D have duty cycles that are reliably maintained at 50%.

FIGS. 2(A) to 2(H) are timing diagrams depicting the timing relationships of delay clock signals A, −A, B, −B, C, −C, D, and −D as produced by four-stage, mutual interpolating DLL circuit 100 (FIG. 1). Together with the diagram in FIG. 1, it can be shown that delay clock signal −B is generated by interpolating delay clock signals A and −D, delay clock signal C is generated by interpolating delay clock signals −B and −A, delay clock signal −D is generated by interpolating delay clock signals C and B, delay clock signal −A is generated by interpolating delay clock signals −D and −C, delay clock signal B is generated by interpolating delay clock signals −A and D, delay clock signal −C is generated by interpolating delay clock signals B and A, delay clock signal D is generated by interpolating delay clock signals −C and −B, and finally delay clock signal A is generated by interpolating delay clock signals D and C. In effect, the sub-loop feedback and interpolation arrangement employed by delay cell chain 120 constrains the generation of delay clock signals A, −A, B, −B, C, −C, D, and −D in a manner that can be represented by eight constraint equations. Thus, eight constraint equations control the generation of the eight clock phases produced by DLL circuit 100. In addition to outer loop feedback circuit 130, which fixes the period of each delay clock signal A, −A, B, −B, C, −C, D, and −D to $T_{PERIOD}$, the rising and falling edges of each delay clock signal A, −A, B, −B, C, −C, D, and −D are concurrently determined by this set of simultaneously linear constraint equations. It can be shown that the determinant of these simultaneous equations is not zero since the coefficients of the determinant are made of interpolating factors of ⅔ and ⅓ (i.e., as defined by setting the bias current $I_S$ to be two times bias current $I_F$). Hence, a unique solution of the set of equations is therefore obtained when mutual-interpolating DLL circuit 100 is in the lock state (i.e., buffered reference clock signal $D_{CK}$ is synchronized with delay clock signal D), and the multiphase delay clock signals A, −A, B, −B, C, −C, D, and −D inherently exhibit 50% duty cycle because all the clock phases are constrained and regulated by the architecture. Mutual-interpolating DLL circuit 100 therefore is not sensitive to process and temperature variations, and the additional duty correction circuitry that is required in conventional DLL circuits is not necessary in DLL circuit 100.

Stated differently, unlike the conventional DLL circuits that are fully reliant on the fabricated similarity of the delay cells, and have only one constraint equation to control the generation of multiphase clock signals, mutual-interpolating DLL circuit 100 is constrained by a set of simultaneous equations to control the waveform of clocks. The clock phase relationships between the multiphase clock signals A, −A, B, −B, C, −C, D, and −D are therefore preserved by these additional simultaneous equations. That is, in conventional DLL circuits, the clock phases at the output of each sequential delay cell are determined solely by the sequential delay introduced at each delay cell, which can differ due to fabrication variations. Conversely, the eight clock phases generated in mutual-interpolating DLL circuit 100 are not solely generated by sequentially delaying the reference clock signal, but are determined by two clock phases within the delay chain.

FIGS. 3 and 4(A) to 4(H) respectively show both circular phase and vector representations associated with delay clock signals A, −A, B, −B, C, −C, D, and −D produced by mutual-interpolating DLL circuit 100. As indicated in FIG. 3, the eight clock phases are uniformly distributed with 45° separation between each adjacent delay clock signal. For example, the phase of delay clock signal −B differs from the phase of delay clock signal A by 45°. The active interpolation utilized to produce each delay clock signal is depicted by vector summation in FIGS. 4(A) to 4(H). For example, as shown in FIG. 4(A), delay clock signal −B is vector summation of delay clock signals A and −D. The eight vector summations depicted in FIGS. 4(A) to 4(H) occur concurrently, and are adjusted by the outer loopback path of the DLL. The delay clock signal generated by one delay cell propagates its effect to the generation of other delay clock signals by way of the sub-loop feedback arrangement (e.g., sub-loop feedback lines 127, shown in FIG. 1). Because of this mutual-locking sub-loop feedback mechanism, unlike conventional DLL circuits, mutual interpolating DLL circuit 100 generates well-defined delay clock signals having 50% duty cycles and uniform clock phases even when process and temperature variations occur.

Figure 5:
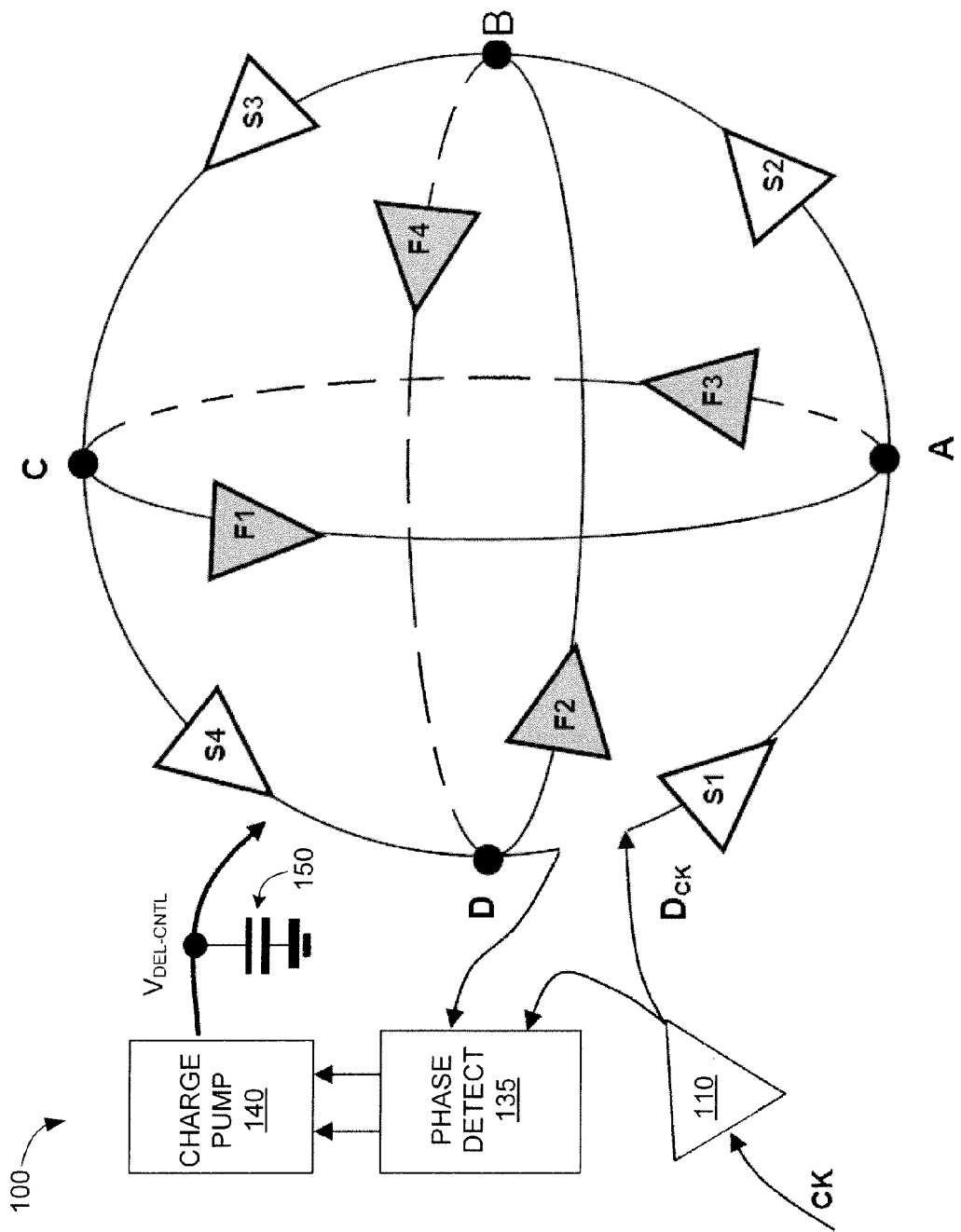
FIG. 5 is a three-dimensional (3-D) plot showing the sub-feedback arrangement of the DLL circuit of FIG. 1.

FIG. 5 illustrates mutual interpolating DLL circuit 100 using a 3-D plot that shows the sub-loop feedback mechanism utilized by the four-stage delay chain. Single-ended connections are shown for simplicity. Drivers F1 to F4 and S1 to S4 are controlled by the outer loop feedback circuit formed by input buffer 110, phase detector 135, charge pump 140, and loop filter 150. Note that the sub-loop feedback arrangement does not create stability problem in mutual-interpolating DLL circuit 100 because the sub-loop feedback path (i.e., the signals generated by drivers F1 to F4) is much faster than the outer loopback path (i.e., the serial connection of drivers S1 to S4), where the slower timing constant is controlled by the loop filter capacitor. The bandwidth of sub-loop feedback paths are much wider than the bandwidth of the outer loop for delay control. The value of loop filter capacitor is usually made large in DLL design to reduce outer loop bandwidth in order to reject high frequency interference noise. There are no capacitors added in the sub-loop feedback paths, except small parasitic capacitance. Hence, the bandwidth of sub-loop feedback is much wider than that of the outer loop. The response time of sub-loop feedback is corresponding faster. Stability is not a concern in the design of a mutual-interpolating DLL due to the bandwidth difference between outer and sub-loop feedback paths. The bandwidth difference can be more than a decade. The feedback loops won't be interactive to each other because the wide difference in their respective loop time constants (where one time constant approximately equals 1/bandwidth).

Figure 6:
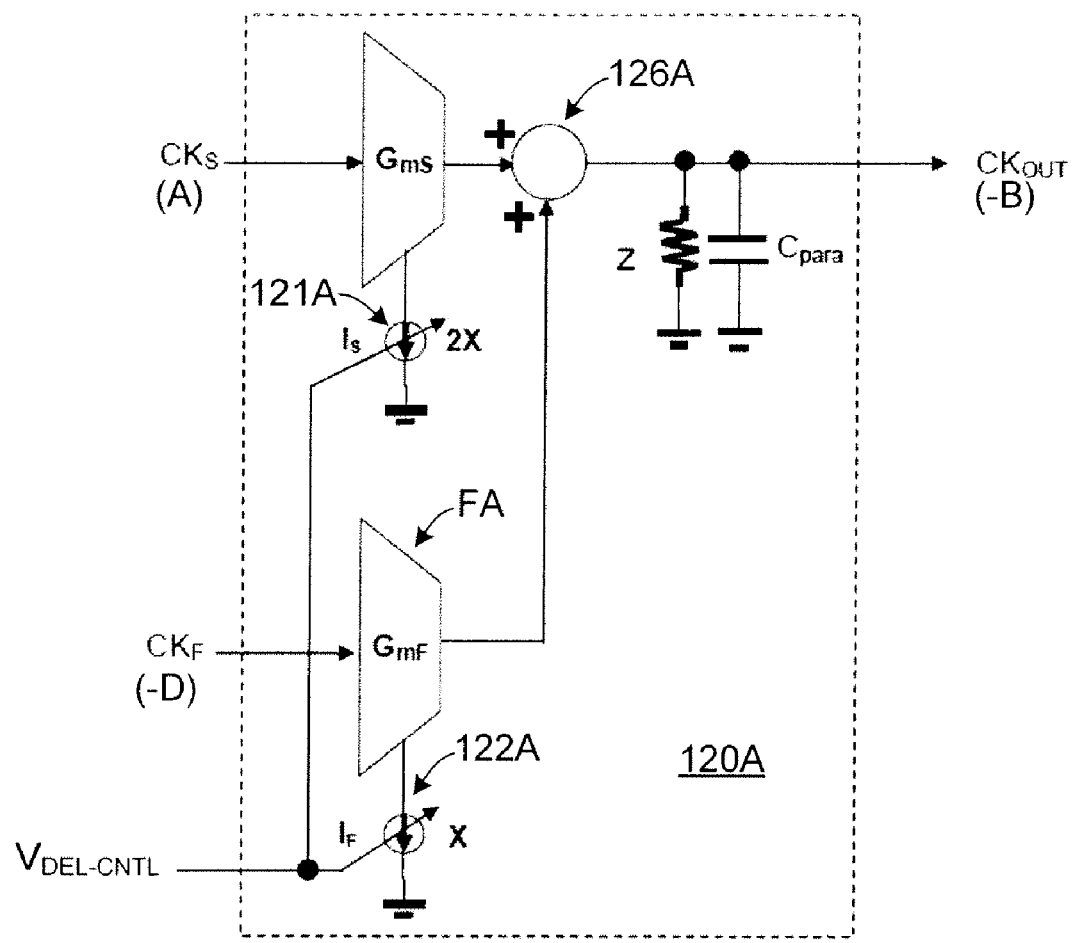
FIG. 6 is a block diagram showing an exemplary delay cell utilized in a DLL circuit according to an embodiment of the present invention.

FIG. 6 shows the block diagram of a delay cell 120A that can be utilized in DLL circuit 100 according to a specific embodiment of the present invention. Delay cell 120A utilizes two transconductors $G_{mF}$ and $G_{mS}$, bias circuits 121A and 122A, and a summation circuit 126A, and a resistive load Z to achieve the functions of delay and interpolation that are provided by the drivers. A capacitor $C_{para}$ is sized to account for the loading of parasitic capacitance and the input loading of next stage (e.g., a delay cell receiving delay clock signal $CK_{OUT}$). The delay control to each delay cell 120A is provided through delay control signal $V_{DEL-CNTL}$, which adjusts the biasing current drawn from transconductors $G_{mF}$ and $G_{mS}$ by bias circuits 121A and 122A, respectively. Bias circuits 121A and 122A are fabricated factor of two is designed for the magnitude of biasing current (i.e., $I_S=2*I_F$). This factor of two is required to perform the function of interpolating and to implement the timing relationship depicted in FIG. 2. For example, referring again to FIG. 4(A), the interpolating equation for delay clock signal −B can be derived as 2*A/3+(−D)/3. Since the phase of delay clock signal −B is closer to the phase of delay clock signal A than it is to the phase of delay clock signal −D, the driving strength for delay clock signal A needs to be two times stronger than that for delay clock signal −D. Here, delay clock signal A is connected to transconductor $G_{mS}$, and delay clock signal −D is applied to the input terminal of transconductor $G_{mF}$. Through summation circuit 126A and resistive load Z, the interpolated delay clock signal −B is generated.

Figure 7A:
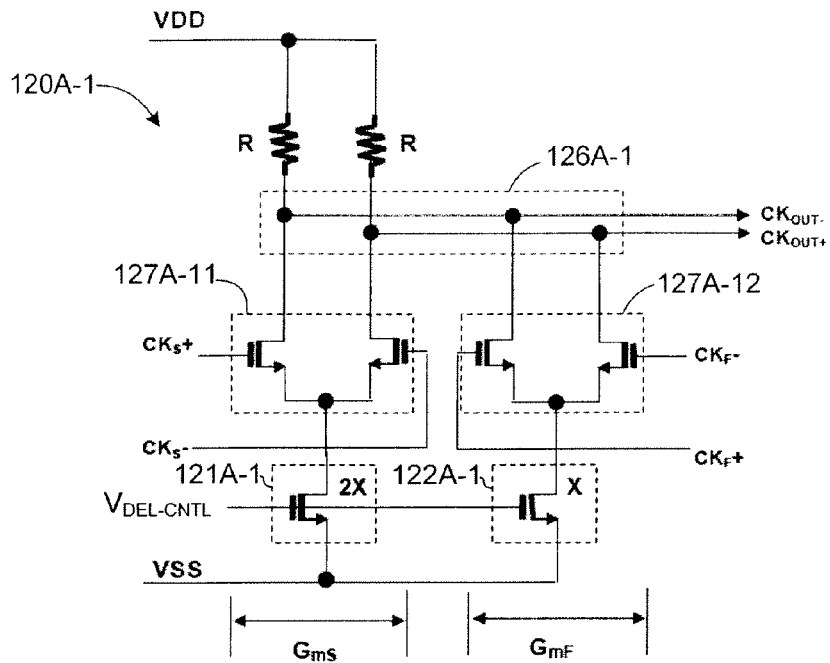
FIGS. 7(A) and 7(B) are schematic diagrams showing the exemplary delay cell of FIG. 6 in additional detail according to alternative embodiments of the present invention.

FIG. 7(A) shows the circuit diagram of a delay cell 120A-1 that can be utilized in DLL circuit 100 according to another specific embodiment of the present invention. Two input differential pairs 127A-11 and 127A-12 and associated bias transistors 121A-1 and 122A-1 are used to implement transconductors $G_{mS}$ and $G_{mF}$, and serve as the input stage of an interpolator. Note that signal designations $CK_{S+}$, $CK_{S-}$, $CK_{F+}$ and $CK_{F-}$ are utilized to generically represent the delay clock signals received from a preceding stage and from the sub-loop feedback circuit in the manner described above. A summation circuit 126A-1 is implemented by direct connection at the drain nodes of differential pairs 127A-11 and 127A-12. The resistive loads Z are simple resistors. As mentioned above, the biasing currents generated through bias transistors 121A-1 and 122A-1 differ by a factor of two to support the interpolation function. The delay function is achieved by tuning the tail current using bias control signal $V_{DEL-CNTL}$, which is generated by the outer feeback loop of the DLL circuit in the manner described above. Note that the architecture of delay cell 120A-1 provides the functions of delay and interpolating simultaneously.

Figure 7B:
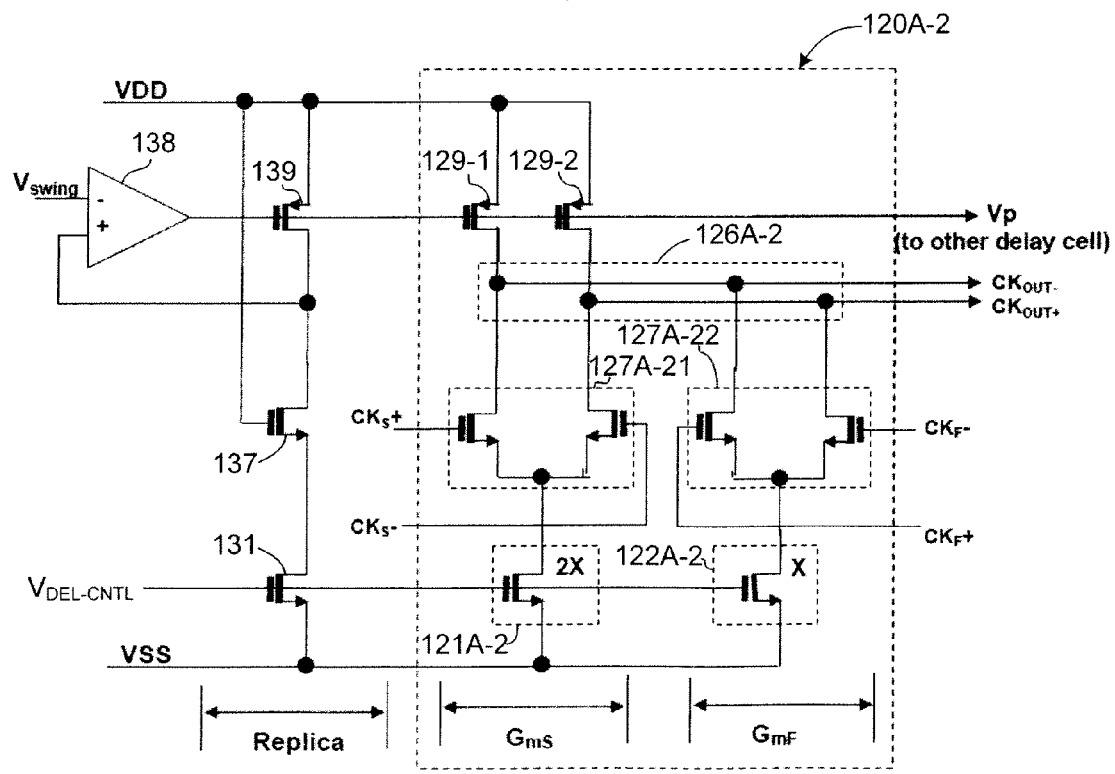

FIG. 7(B) shows the circuit diagram of a delay cell 120A-2 that can be utilized in DLL circuit 100 according to another specific embodiment of the present invention. Similar to delay cell 120A-1 (see FIG. 7(A)), delay cell 120A-2 includes two input differential pairs 127A-21 and 127A-22 and associated bias transistors 121A-2 and 122A-2 that implement transconductors $G_{mS}$ and $G_{mF}$. However, instead of the resistor load used in delay cell 120A-1, delay cell 120A-2 utilizes PMOS transistors 129-1 and 129-2. A replica circuit formed by an operation amplifier 138, a PMOS transistor 139, and NMOS transistors 131 and 137, is connected in parallel with all delay cells 120A-2 in the delay chain, and provides a biasing voltage Vp to all PMOS transistors (e.g., 129-1 and 129-2) in the delay chain. Further, note that in delay cell 120A-1 (FIG. 7(A)), the voltage swing of is not fixed, and delay clock signal $CK_{OUT}$ depends on the voltage level of bias control signal $V_{DEl-CNTL}$ for delay control. In contrast, the replica circuit provided in conjunction with delay cell 120A-2 clamps a swing of delay clock signal $CK_{OUT}$ by way of a feedback mechanism associated with operational amplifier 138. The swing magnitude is defined by feedback signal $V_{swing}$, which is applied to the negative input terminal of operational amplifier 138.

Figure 8:
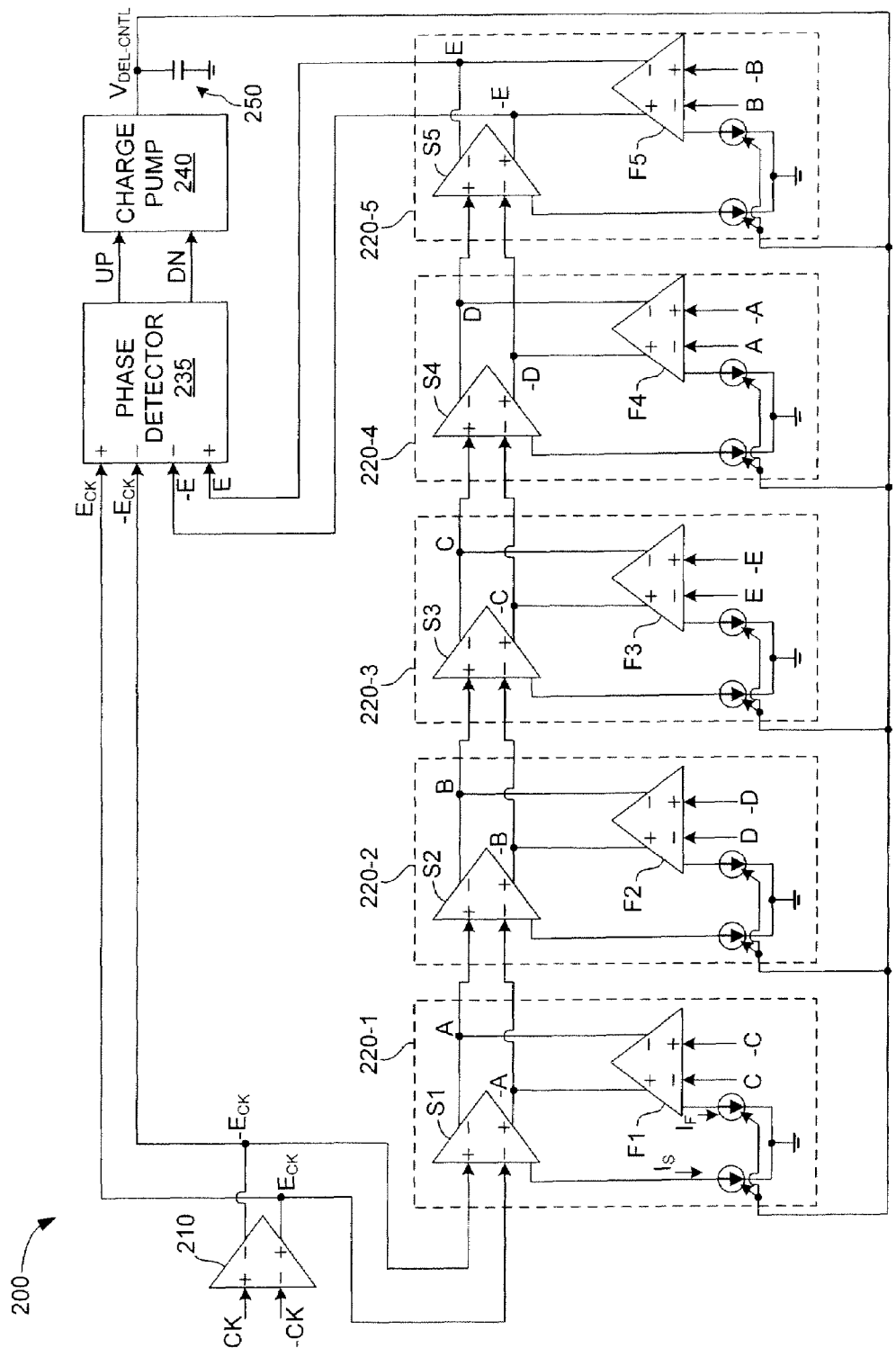
FIG. 8 is a simplified circuit diagram showing a five-stage DLL circuit according to another embodiment of the present invention.

FIG. 8 is a simplified diagram depicting a five-stage mutual-interpolating DLL circuit 200 according to another embodiment of the present invention. DLL circuit 200 includes an optional input buffer 210, phase detector 235, charge pump 240, filter 250, and five delay cells 220-1 to 220-5 that respectively generate ten delay clock signals A, –A, B, –B, C, –C, D, –D, E, and –E in a manner similar to that described above (i.e., such that each delay clock signal has a unique clock phase, and such that each delay clock single has a 50% duty cycle).

Similar to the arrangement described above with reference to FIG. 1, DLL circuit 200 may be effectively described using a set of ten mutual-constraint equations. As such, mutual-interpolating DLL circuits 100 and 200 collectively illustrate that DLL circuits formed in accordance with the present invention can be implemented using any even or odd number of delay cells, depending on the applications for multiphase clock generation. The constraint equations are automatically imposed with the implementation of interpolator-type delay cell and the DLL architecture. Hence, the mutual-interpolating DLL circuits of the present invention are able to provide a well-controlled generation of multiphase clocks, regardless of semiconductor process and temperature variations.

Figure 9:
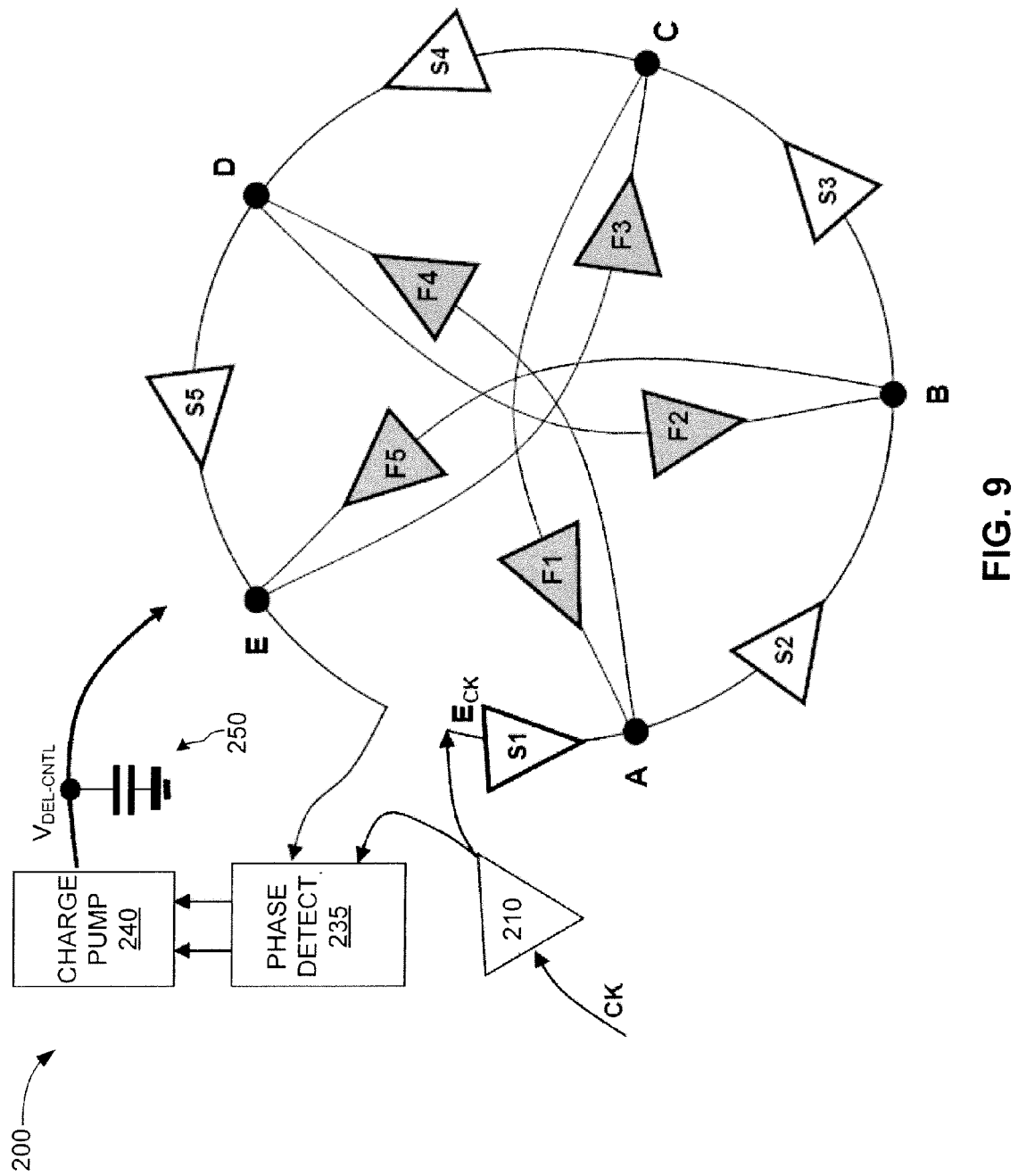
FIG. 9 is a 3-D plot showing the sub-feedback arrangement of the five-stage DLL circuit shown in FIG. 8.

FIG. 9 illustrates mutual interpolating DLL circuit 200 using a 3-D plot that shows the sub-loop feedback mechanism utilized by the five-stage delay chain. Single-ended connections are shown for simplicity. Drivers F1 to F5 and S1 to S5 (which are associated with delay cells 220-1 to 220-5 as illustrated in FIG. 8) are controlled by the outer loop circuit formed by input buffer 210, phase detector 235, charge pump 240, and loop filter 250 in the manner described above. The sub-feedback paths (F drivers) are connected between every other two delay stages (e.g., driver F1 feeds back delay clock signal C from driver S3, which is combined with reference clock signal $E_{CK}$ in the first stage to produce delay clock signal A). Unlike the conventional DLL which implements straight forward delay chain architecture, FIG. 9 clearly demonstrates the inter-locking and mutual-constraint architecture for each clock phase because of built-in sub-loop feedbacks.

Figure 10:
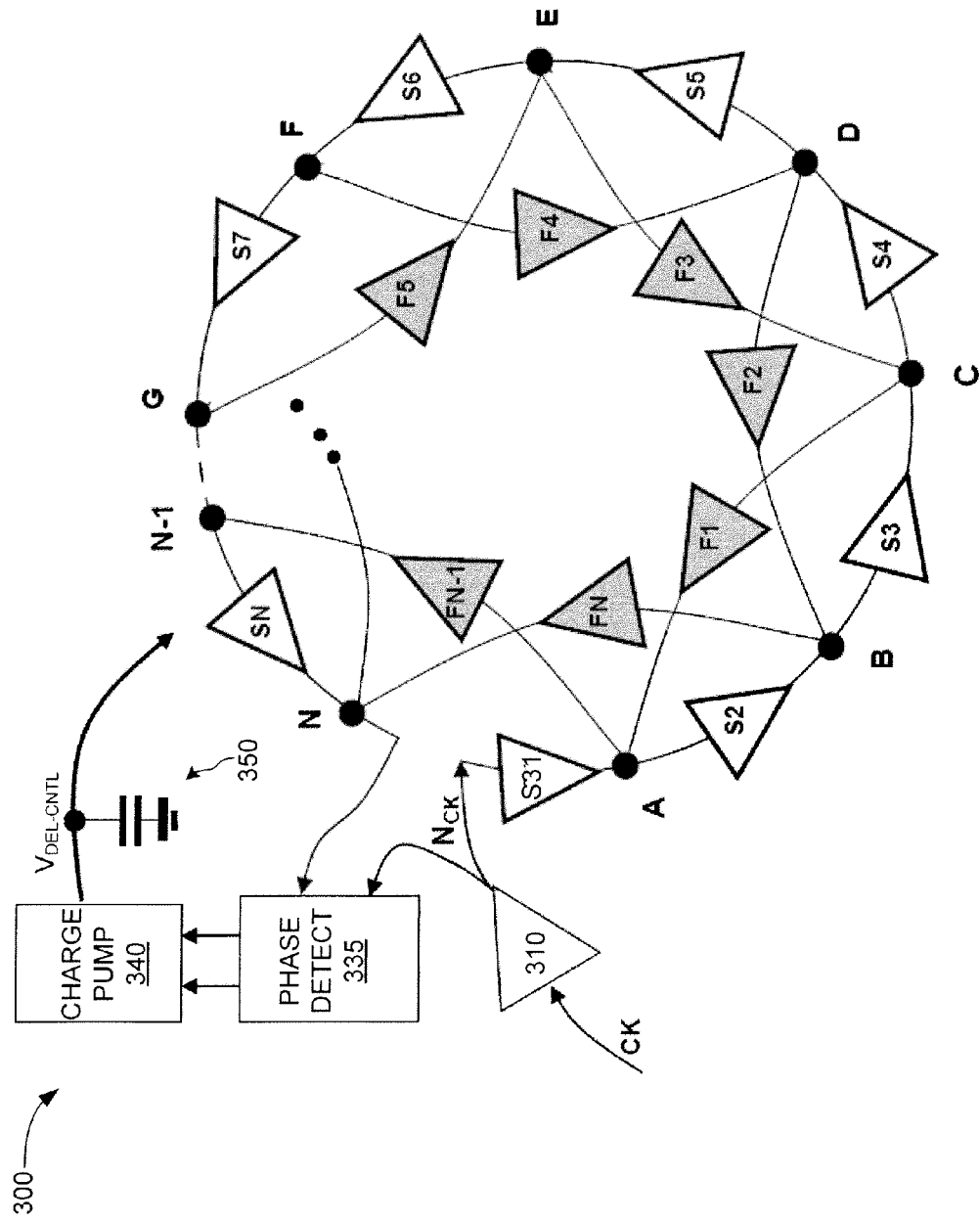
FIG. 10 is a 3-D plot showing the sub-feedback arrangement of a multiple-stage DLL circuit according to another embodiment of the present invention.

FIG. 10 is a 3-D plot showing a mutual interpolating DLL circuit 300, which represents the generalized extension of mutual-interpolating DLL circuits 100 and 200 with an N-stage delay chain, where N is the total number of delay cells and N is greater than 2. The N-stage delay chain provides a total of 2*N delay clock signals respectively having 2*N unique phases. The operation principle is the same for either even or odd number of stages. However, to maintain proper clock phase relationship, the polarity of signal connections is slightly different for even and odd number of delay cells. This polarity difference in connections can be found between FIG. 2 (four-stage) and FIG. 8 (five-stage). FIG. 10 depicts general principle of the mutual-interpolating DLL in single-ended connections. The plot does not exhibit the polarity issue.

Figure 11:
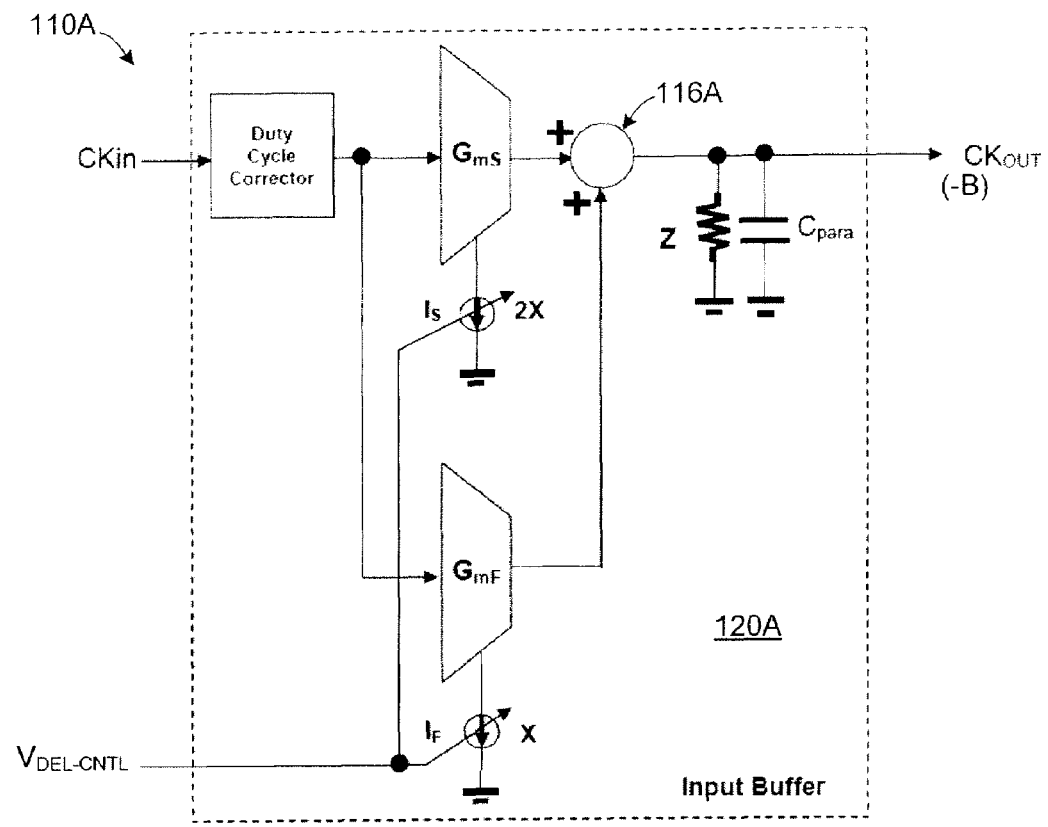
FIG. 11 is a block diagram showing an exemplary input buffer utilized in a DLL circuit according to another embodiment of the present invention.
Figure 12:
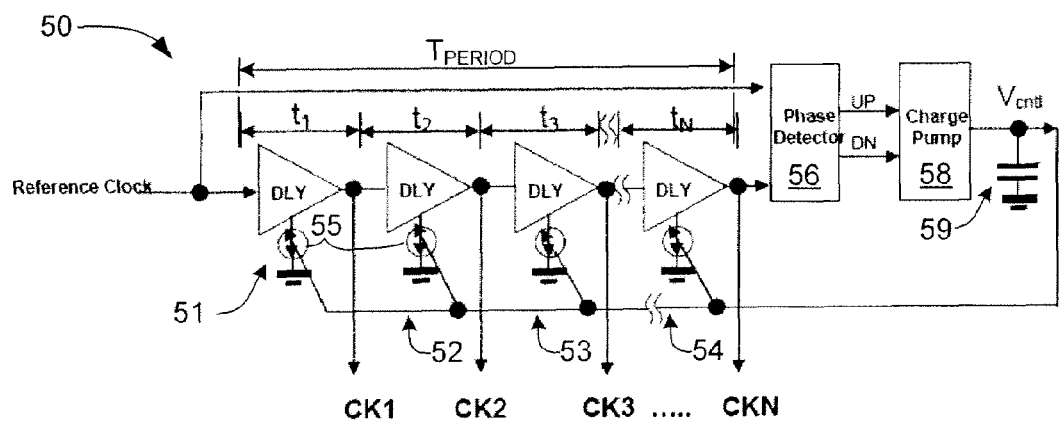
FIG. 12 is a simplified circuit diagram showing a conventional DLL circuit.

As mentioned above, input buffers (e.g., input buffer 110; see FIG. 1) are utilized to better match the reference clock waveform with the waveforms of the delay clock signals generated by the delay cells. FIG. 11 is a circuit diagram showing an exemplary input buffer 110A, which is substantially the same as delay cell 120A described above with reference to FIG. 6, but the two transconductor input terminals are shorted together and connected to receive the input reference clock by way of an optional duty cycle corrector circuit. If the input clock duty cycle is not well-defined around 50%, the duty cycle corrector circuit can be implemented to correct the duty cycle problem using known techniques before it is sent to the mutual-interpolating DLL circuit. No further duty cycle corrections will be necessary in the DLL circuit since the architecture automatically enforces the balancing between clock phases by using mutual interpolating. The tail biasing current is also adjusted by the loop filter voltage $V_{DEL-CNTL}$ to produce the same driving strength as produced in delay cell 120A.

Although the present invention has been described with respect to certain specific embodiments, it will be clear to those skilled in the art that the inventive features of the present invention are applicable to other embodiments as well, all of which are intended to fall within the scope of the present invention.

For example, while the present invention is described above to specific embodiments in which every delay cell of the delay cell chain receives a second input clock signal from a selected delay cell via one or more sub-loop feedback lines, it may be possible to produce a suitable DLL circuit in which only a subset (e.g., one or more) of the delay cells in the delay cell chain receive second clock signals via sub-loop feedback lines. For example, referring back to FIG. 1, when sub-loop feedback lines are used in each delay cell, each delay clock signal is substantially guaranteed to have a 50% duty cycle. However, if the interpolation function was omitted from delay cells 120-1, 120-3 and 120-4 (e.g., drivers F1, F3 and F4 and their associated sub-loop feedback lines were omitted), then only delay clock signals B and –B would assuredly include 50 duty cycles. Although such a limited sub-loop feedback arrangement would provide DLL performance that could be better than conventional approaches and would simplify the overall delay cell chain circuit, a problem with this implementation is that there is no guarantee that other clock signals (A, –A, C, –C, D and –D) will have 50% duty cycles because there are no constraint equations for these other clock signals.

In accordance with another alternative embodiment, although the invention is described above with reference to specific embodiment that employ sub-loop feedback lines from every other two delay cells, it is also possible to route the sub-loop feedback lines from every other three delay cells or even every other four delay cells. For example, in the embodiment shown in FIG. 1 the delay clock signal D is fed back two delay cells (i.e., from delay cell 120-4 to delay cell 120-2). In an embodiment where the sub-loop feedback lines are from every other three delay cells, delay clock signal D would be fed back to delay cell 120-1. Note that the mutual simultaneously equations are still valid, but have different coefficients (e.g., ¾ and ¼ instead original ⅔ and ⅓). A problem with utilizing sub-loop feedback lines from every other three or more delay cells is that the interpolating signals (connecting to drivers S and F) may be separated too far in time, and therefore cannot achieve good quality interpolation in actual circuit implementations.

The invention claimed is:

1. A delay-locked loop (DLL) circuit for generating a plurality of delayed clock signals in response to an applied reference clock signal, the DLL circuit comprising:
    a delay cell chain including a plurality of series-connected delay cells, each delay cell of the delay cell chain includes generating means for generating one or more of said delay clock signals; and
    an outer feedback loop circuit having a first input terminal coupled to the applied reference clock signal, a second input terminal coupled to receive a selected delay clock signal generated by a last-sequential delay cell of the delay cell chain, and means for generating a delay control signal $V_{DEL-CNTL}$ and for transmitting the delay control signal to each of the plurality of delay cells in the delay cell chain,
    wherein said delay cell chain further comprises at least one sub-loop feedback line extending from a first delay cell to a second delay cell of said delay cell chain, and
    wherein said generating means of said first delay cell includes means for interpolating a first delay clock signal and a second delay clock signal, the first delay clock signal being received from a preceding delay cell of the delay cell chain, and the second delay clock signal being received from said second delay cell of the delay cell chain via said at least one sub-loop feedback line.

2. The DLL circuit according to claim 1, wherein said generating means of said first delay cell includes a first driver and a second driver, the first driver having one or more input terminals connected to receive the first delay clock signal from said preceding delay cell of the delay cell chain, and the second driver having one or more input terminals connected to receive the second delay clock signal from said second delay cell of the delay cell chain via said at least one sub-loop feedback line.

3. The DLL circuit according to claim 2, wherein a first output terminal of the first driver is connected to a second output terminal of the second driver, whereby the first and second delay clock signals are interpolated by the first and second drivers.

4. The DLL circuit according to claim 2, wherein each delay cell of the delay cell chain further comprises delay means for delaying an output signal generated by each of the first and second drivers by a delay period determined by the delay control signal $V_{DEL-CNTL}$.

5. The DLL circuit according to claim 4, wherein the delay means comprises first and second biasing circuits for respectively generating a first and second biasing currents in said first and second drivers in response to said delay control signal $V_{DEL-CNTL}$.

6. The DLL circuit according to claim 5, wherein the first and second biasing circuits include means for generating the first and second biasing currents such that the first biasing current is twice the magnitude of the second biasing current.

7. The DLL circuit according to claim 6, wherein the outer loop feedback circuit comprises:
    a phase detector having a first input terminal coupled to receive the applied reference clock signal, a second input terminal coupled to receive a selected delay clock signal generated by the last-sequential delay cell of the delay cell chain; and
    a charge pump for generating said delay control signal in response to output signals generated by the phase detector.

8. The DLL circuit according to claim 7, wherein the outer loop feedback circuit further comprises a delay loop line connected between an output terminal of the charge pump and said delay means of each of the plurality of delay cells, and a loop filter connected to the delay loop line.

9. The DLL circuit according to claim 1, further comprising means for buffering the applied reference clock signal such that the buffered reference clock signal has signal characteristics that are similar to signal characteristics associated with the delay clock signals generated by each of the plurality of delay cells.

10. The DLL circuit according to claim 1, wherein said generating means of said first delay cell comprises:
    a first transconductor having an input terminal connected to receive the first delay clock signal from said preceding delay cell of the delay cell chain;
    a second transconductor having an input terminal connected to receive the second delay clock signal from said second delay cell of the delay cell chain via said at least one sub-loop feedback line;
    a summation circuit having input terminals respectively connected to output terminals of the first and second transconductors; and
    a resistive load connected to an output terminal of the summation circuit.

11. The DLL circuit according to claim 1, wherein said generating means of said first delay cell comprises:
    a first differential pair having an input terminal connected to receive the first delay clock signal from said preceding delay cell of the delay cell chain; and
    a second differential pair having an input terminal connected to receive the second delay clock signal from said second delay cell of the delay cell chain via said at least one sub-loop feedback line,
    wherein a drain node of the first differential pair is directly connected to a drain node of the second differential pair.

12. The DLL circuit according to claim 11, wherein said generating means of said first delay cell comprises first and second bias transistors respectively connected between source nodes of the first and second differential pairs and a low voltage source,
    wherein gate terminals of the first and second bias transistors are connected to receive the delay control signal $V_{DEL-CNTL}$, and
    wherein the first and second bias transistors are sized such that a biasing current generated through the first bias transistor is two times a biasing current generated through the second bias transistor.

13. The DLL circuit according to claim 12, wherein said generating means of said first delay cell comprises resistors connected between a high voltage source and the drain nodes of the first and second differential pairs.

14. The DLL circuit according to claim 12, wherein said generating means of said delay first cell comprises first and second PMOS transistors connected between a high voltage source and the drain nodes of the first and second differential pairs, and
    wherein the delay cell chain further comprises means for provides a biasing voltage to the first and second PMOS transistors.

15. The DLL circuit according to claim 12, wherein the delay cell chain comprises an odd number of delay cells.

16. The DLL circuit according to claim 1, wherein two or more of said series-connected delay cells are connected between the first and the second delay cells.

17. A delay-locked loop (DLL) circuit for generating a plurality of delayed clock signals in response to an applied reference clock signal such that all of the delayed clock signals and the reference clock signal have a predetermined clock period, and such that each of the delayed clock signals has a unique phase, the DLL circuit comprising a delay cell chain including a plurality of series-connected delay cells, each delay cell of the delay cell chain includes generating means for generating one or more of said delay clock signals, wherein said generating means of a first delay cell of said delay cells includes means for interpolating a first delay clock signal and a second delay clock signal, the first delay clock signal being received from a second delay cell of the delay cell chain, and the second delay clock signal being received from a third delay cell of the delay cell chain.

18. The DLL circuit according to claim 17, wherein the plurality of delay cells comprise series-connected delay cells including an initial delay cell and a final delay cell, and wherein the first delay clock signal received by said first delay cell is generated by a preceding delay cell of said series-connected delays cells, and said second clock signal received by said first delay cell is generated by a subsequent delay cell of said series-connected delays cells.

19. A delay-locked loop (DLL) circuit for generating a plurality of delayed clock signals in response to an applied reference clock signal, wherein the DLL circuit comprises:

a delay cell chain including:

an initial delay cell coupled to receive the reference clock signal, the initial delay cell including means for generating an initial delayed clock signal such that the initial clock signal has a first phase that differs from a reference phase of the reference clock signal by a predetermined phase amount, one or more intermediate delay cells including a first intermediate delay cell coupled to receive the initial delayed clock signal, the said one or more intermediate delay cells including means for generating one or more intermediate delayed clock signals, each of the intermediate delayed clock signals having a corresponding second phase that differs from the first phase; and a final delay cell coupled to receive one of the intermediate delayed clock signals, the final delay cell including means for generating a final delayed clock signal having a final phase; and an outer feedback loop circuit including means for comparing the reference clock signal with the final delay clock signal, and means for generating a delay control signal $V_{DEL-CNTL}$ that varies according to a difference between the reference phase and the final phase, wherein said delay cell chain further comprises at least one sub-loop feedback line extending from the final delay cell to one of the intermediate delay cells of said delay cell chain, and wherein said generating means of said one of said intermediate delay cells includes means for interpolating a first delay clock signal received from a preceding delay cell of the delay cell chain and said final delay clock signal.

20. The DLL circuit according to claim 19, wherein said generating means of said one of said intermediate delay cells includes a first driver and a second driver, the first driver having an input terminal connected to receive the first delay clock signal from said preceding delay cell of the delay cell chain, and the second driver having one or more input terminals connected to receive the final delay clock signal from said final delay cell via said at least one sub-loop feedback line.

* * * * *